United States Patent [19]

Betzl et al.

[11] 4,267,535

[45] May 12, 1981

[54] SWITCHING CIRCUIT CONSISTING OF CTD LINES

[75] Inventors: Hermann Betzl; Friedrich Kuenemund, both of Munich; Roland Schreiber, Riemerling, all of Fed. Rep. of Germany

[73] Assignee: Siemens Aktiengesellschaft, Berlin & Munich, Fed. Rep. of Germany

[21] Appl. No.: 14,138

[22] Filed: Feb. 22, 1979

[30] Foreign Application Priority Data

Feb. 28, 1978 [DE] Fed. Rep. of Germany ....... 2808604

[51] Int. Cl.³ .................... H03H 17/06; G11C 27/00; G11C 21/00
[52] U.S. Cl. ............................... 333/165; 307/221 C; 307/221 D
[58] Field of Search ........... 307/221 R, 221 D, 221 C; 333/167, 168, 165, 110; 357/24

[56] References Cited

U.S. PATENT DOCUMENTS

| | | | |
|---|---|---|---|
| 1,624,551 | 4/1927 | Jammer | 333/168 |
| 4,029,902 | 6/1977 | Bell, Jr. et al. | 333/110 X |
| 4,130,894 | 12/1978 | Merrill et al. | 307/221 D X |

FOREIGN PATENT DOCUMENTS

1386729  3/1975  United Kingdom ...................... 357/24

OTHER PUBLICATIONS

Sequin–"Two Dimensional Charge Transfer Arrays", in IEEE Journal of Solid–State Circuits, vol. SC9, No. 3, Jun. 1974; pp. 134–142.
Sangster et al–"Bucket Brigade Electronics–New Possibilities For Delay, Time-Axis Conversion, and Scanning", in IEEE Journal of Solid–State Circuits, vol. SC4, No. 3, Jun. 1969; pp. 131–136.
Boyle et al–"Charge Coupled Semiconductor Devices", in Bell System Technical Journal, No. 4, Apr. 1970; pp. 587–593.
Sequin–"Linearity of Electrical Charge Injection into Charge–Coupled Devices", in IEEE Journal of Solid–State Circuits, vol. SC10, No. 2, Apr. 1975; pp. 81–92.
Wen–"Design and Operation of a Floating Gate Amplifier", in IEEE Journal of Solid–State Circuits, vol. SC6, Dec. 1974; pp. 410–414.

*Primary Examiner*—Marvin L. Nussbaum
*Attorney, Agent, or Firm*—Hill, Van Santen, Steadman, Chiara & Simpson

[57] ABSTRACT

A switching circuit (2) consisting of CTD lines ($p_1,q_1,p_2,q_2,p_3,q_3$) is specified in which the properties characteristic for non-unidirectional microwave lines (FIG. 1) are also retained for CTD switching circuits (FIG. 2). To that end, CTD lines (for example, $p_1,q_1$) exhibiting mutually opposing conducting directions are combined into a line pair and each incoming line ($p_1$) is connected with each out-going line ($q_1$). The connection ensues partially via CTD lines ($c_1+c_1'$) and, for the other part, via a galvanic line ($L_1$). Such switching circuits can be employed for the construction of CTD filters with steepness-increased transmission characteristic and also for the construction of correcting circuits.

20 Claims, 21 Drawing Figures

$$S_a = \frac{e^{-i\beta}}{u+v+1} \begin{Vmatrix} u+v-1 & -2\sqrt{v} & -2\sqrt{u} \\ -2\sqrt{v} & u-v+1 & -2\sqrt{uv} \\ -2\sqrt{u} & -2\sqrt{uv} & v-u+1 \end{Vmatrix}$$

FIG 4

$$S_b = e^{-i\beta} \begin{Vmatrix} \dfrac{c_2}{c_3} & \dfrac{y(c_1+c_1')}{vc_3}K_4 Q_2 & \dfrac{z(c_1+c_1')}{uc_3}K_6 Q_3' \\ \dfrac{c_1+c_1'}{c_3}Q_1' K_4' & \dfrac{xc_2}{vc_3}K_4 K_4' & \dfrac{z(c_1+c_1')}{uc_3}Q_3 K_4' K_6 \\ \dfrac{c_1+c_1'}{c_3}Q_1 K_6' & \dfrac{y(c_1+c_1')}{vc_3}Q_2' K_6' K_4 & \dfrac{wc_2}{uc_3}K_6 K_6' \end{Vmatrix}$$

FIG 5

With $K_6 = K_6' = 1$ and $v > u + 1$ it follows that $$\frac{c_2}{c_3} = r = \frac{v+u-1}{v+u+1} \ ; \ \frac{x}{v} = \frac{v-u-1}{v+u-1} \ ; \ \frac{w}{u} = \frac{v-u+1}{v+u-1}$$

$$Q_1 = -\sqrt{u} \ ; \ Q_2 = -\frac{\sqrt{v}}{u+1} \ ; \ Q_3 = \sqrt{\frac{v}{u}} \ ; \ \frac{y}{v} = u+1$$

$$Q_1' = \sqrt{v} \ ; \ Q_2' = -\frac{\sqrt{vu}}{u+1} \ ; \ Q_3' = -\frac{1}{\sqrt{u}} \ ; \ \frac{z}{u} = u$$

With $z = w = K_6 = K_6' = Q_1 = Q_2' = Q_3 = Q_3' = 0$,
$\dfrac{c_2}{c_3} = r$ and $c_1' = c_1$ it follows that:

$$S_a' = \dfrac{1}{v+1} \left\| \begin{array}{cc} v-1 & -2\sqrt{v} \\ 2\sqrt{v} & v-1 \end{array} \right\| \triangleq \left\| \begin{array}{cc} r & -\sqrt{1-r^2} \\ \sqrt{1-r^2} & r \end{array} \right\|$$

FIG 10

$$S_b' = \left\| \begin{array}{cc} \dfrac{c_2}{c_3} & \dfrac{y}{v} \cdot \dfrac{c_1}{c_3} K_4 Q_2 \\ \dfrac{c_1}{c_3} Q_1' K_4' & \dfrac{x}{v} \cdot \dfrac{c_2}{c_3} \cdot K_4 K_4' \end{array} \right\|$$

FIG 11

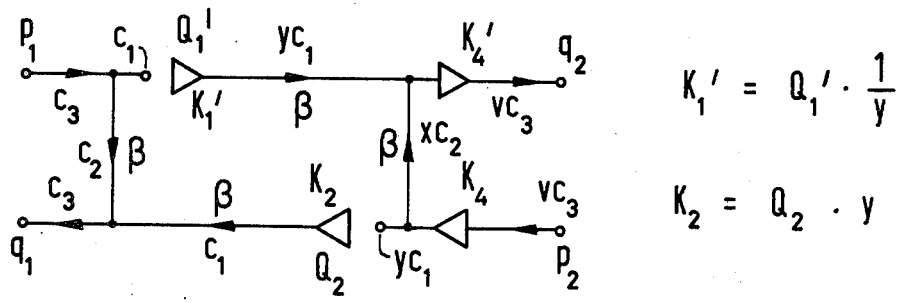

$K_1' = Q_1' \cdot \dfrac{1}{y}$ $K_2 = Q_2 \cdot y$

FIG 12

With $K_4 \cdot K_4' = 1$; $x = y = v$ and $K_1' = -K_2$ $K_4 = v$ ; $K_1' = \sqrt{v}$ $K_4' = \dfrac{1}{v}$ ; $K_2 = -\sqrt{v}$ ; $v = \dfrac{1+r}{1-r}$

FIG 13
$$S_V = \left\| \begin{array}{cc} \dfrac{c_2}{c_3} & \dfrac{c_1}{c_3} K_2 \\ \dfrac{c_1}{c_3} K_1' & \dfrac{c_2}{c_3} \end{array} \right\| \triangleq$$
FIG 14
$$\left\| \begin{array}{cc} r & -\sqrt{1-r^2} \\ \sqrt{1-r^2} & r \end{array} \right\|$$
FIG 15
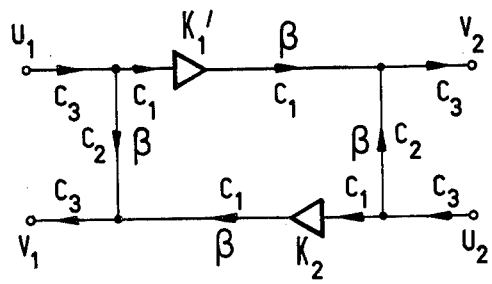
$$K_1' = -K_2 = \sqrt{\dfrac{1+r}{1-r}}$$
FIG 16
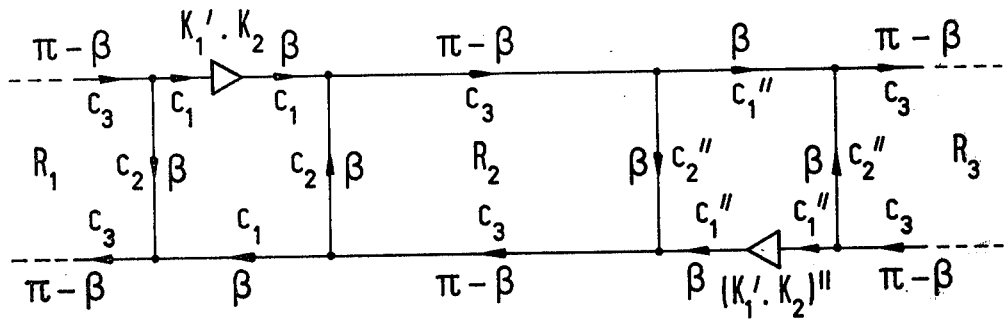
FIG 17
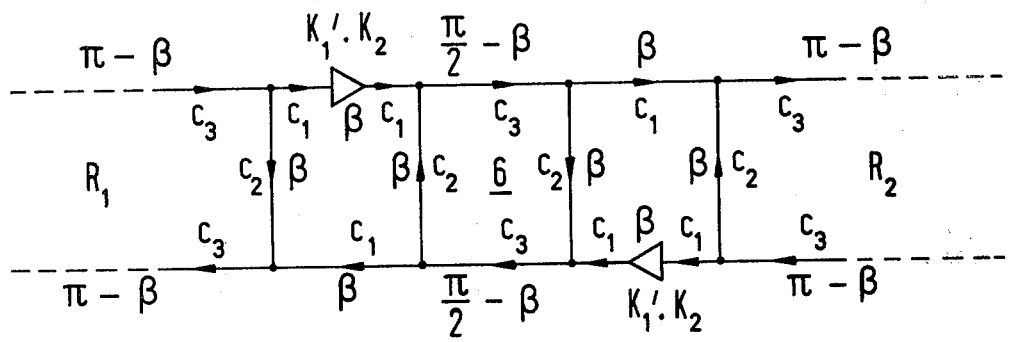

SWITCHING CIRCUIT CONSISTING OF CTD LINES

BACKGROUND OF THE INVENTION

The invention relates to a switching circuit consisting of CTD lines whose individual CTD lines have a unidirectional transmission behavior and whose recriprocal of characteristic impedance is determined by the size of their characteristic transfer capacitances.

Among other things, electric filter circuits have become known from the German Pat. No. 2,453,669 in whose construction self-contained loops with unidirectional transmission behavior can be used. Thereby, known CTD lines (charge transfer devices) can be considered as lines. Such lines are known per se as so-called bucket brigade devices or also as so-called CCD (charge coupled devices). For the operation of such circuit component parts, clock pulse generators are required, as this is likewise described in detail in the German Pat. No. 2,453,669. In this Letters Patent, among other things, it is already pointed out that bucket brigade devices which for example are described in the periodical "IEEE Solid State Circuits", Vol. SC4, June 1969, No. 3, Pages 131 through 136, can be advantageously employed as unidirectional transmission lines. In place of such bucket brigade devices, the aforementioned CCD lines can also be employed, i.e. transmission lines which work according to the principle of coupled charges. Such CCD lines, for example, are specified in "BSTJ" Vol. 49, Pages 589 through 593. The construction of filter circuits has likewise been already specified. As is known, it is often of particular significance precisely for the realization of filter circuits for attaining a predetermined transmission characteristic to provide attenuation peaks in the transmission characteristic upon real or complex frequencies, whereby steepness increases in the attenuation characteristic or the influencing of the transit time in the passband of the filter can be achieved. For the realization of such steepness-increased circuits, switching circuits are advantageous. Because of the unidirectional properties of the CTD lines employed here, however, switching circuits in the usual sense cannot be simulated here without further ado.

SUMMARY OF THE INVENTION

The object of the invention is to specify the construction of CTD switching circuits in which the transmission behavior of non-unidirectional switching circuits, such as microwave circuits for example, is completely retained.

Proceeding from a switching circuit consisting of CTD lines whose individual CTD lines have a unidirectional transmission behavior and whose reciprocal of characteristic impedance is determined by the size of their characteristic transfer capacitances, this object is inventively achieved in that respectively two CTD lines with mutually opposite conducting direction are combined into a line pair; in that the combination of the lines belonging to a line pair ensues by means of their connection via a further CTD line whose conducting direction is directed from the incoming to the out-going line of the respective line pair; and in that each incoming line is connected with the out-going lines of the other line pairs and this connection consists of at least a section of a CTD line, an amplifier and a galvanic line.

Further advantageous embodiments are specified in the subclaims.

In the following, the invention is explained in yet greater detail on the basis of sample embodiments.

BRIEF DESCRIPTION OF THE DRAWINGS

The drawing shows:

FIG. 3 the scattering matrix of the switching circuit according to FIG. 1;

FIG. 4 the scattering matrix of the switching circuit according to FIG. 2;

FIG. 5 the formal interrelationship of a coefficient comparison of the scattering matrices illustrated in FIGS. 3 and 4;

FIG. 9 the terms and the scattering matrices of a two-gate switching circuit which has proceeded from FIG. 1;

FIG. 10 the scattering matrix of a two-gate switching circuit which has proceeded from FIG. 2;

FIG. 11 the electric equivalent circuit diagram of a two-gate switching circuit according to the scattering matrix according to FIG. 10;

FIG. 12 a possibility for the selection of the dimensioning magnitudes of a circuit according to FIG. 11;

FIGS. 13 and 14 the scattering matrices of a two-gate circuit upon introduction of a further simplifying term;

FIG. 15 the electric equivalent circuit diagram of a two-gate switching circuit according to the scattering matrices of FIGS. 13 and 14;

FIG. 16 a section of a filter circuit with CTD resonators which are connected via two-gate switching circuits;

FIG. 17 a section of a filter circuit in which CTD resonators are connected with a CTD switching loop via a two-gate switching circuit;

DETAILED DESCRIPTION

Figure 1:
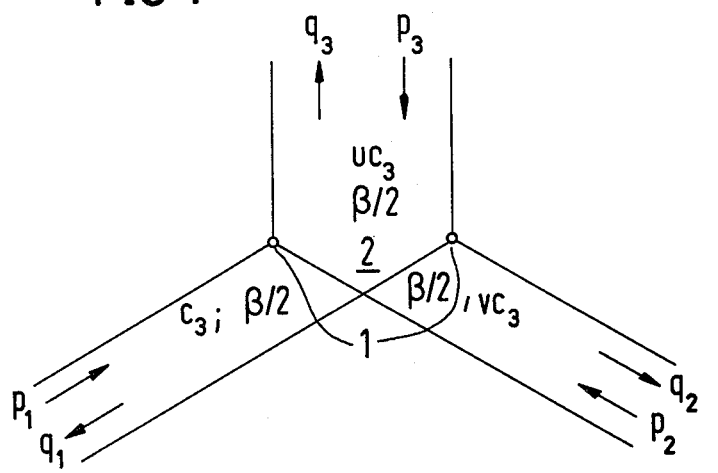
FIG. 1 the electric equivalent circuit diagram of a general switching circuit in the form of a microwave line branching with non-unidirectional properties.

The electric equivalent circuit diagram illustrated in FIG. 1 shows a general switching circuit 2 whose branching points are marked with the reference number 1. Such lines are known per se from microwave technology and as many individual lines as desired can be connected to one another at point 1. For the purpose of a simpler presentation, only three lines are viewed in FIG. 1 and in the following. Corresponding to usual microwave lines, the wave parts incoming to the branching point 1 are illustrated with $p_1$ through $p_3$ and the wave parts out-going from branching point 1 are illustrated with $q_1$ through $q_3$. Further, for the purpose of a simpler presentation, let it be assumed that one line has the reciprocal of characteristic impedance $c_3$ and the two other lines have deviating reciprocals of characteristic impedance $uc_3$ or, respectively, $vc_3$. All lines have the phase constant $\beta/2$.

Figure 2:
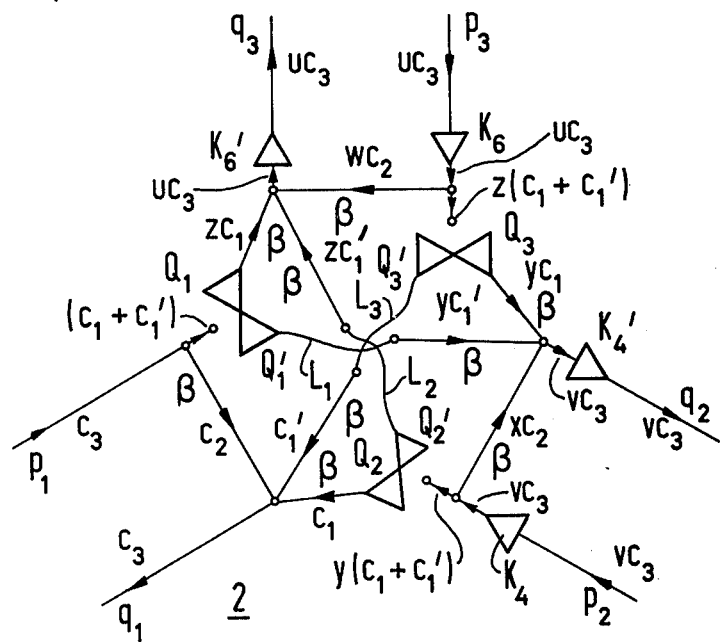
FIG. 2 an electric equivalent circuit diagram according to the invention for the realization of a switching circuit with unidirectional lines and details of the dimensioning conditions.

FIG. 2 shows a circuit diagram corresponding to FIG. 1, which is there likewise designated with the reference number 2. u and v are characteristic dimensioning magnitudes for the switching circuit and mean that factor by which the reciprocals of characteristic impedance of the different lines according to FIG. 1 differ. In contrast to the presentation according to FIG. 1, one has proceeded in FIG. 2 from the fact that the lines employed there have unidirectional transmission properties as is the case for the initially already cited CTD lines. For this reason, the transmission installations of these lines in FIG. 2 are respectively identified by means of allocated arrows and the waves proceeding to the switching circuit 2 are referenced with $p_1$, $p_2$ and $p_3$, and the waves proceeding away from the switching circuit 2 are referenced with $q_1$, $q_2$ and $q_3$. At the same time, these symbols are also used here and in the following for the branch lines themselves. Corresponding to FIG. 1, the line pair $p_3$, $q_3$ has the reciprocal of characteristic impedance $uc_3$, whereas the line pairs $p_1$, $q_1$ or, respectively, $p_2$, $q_2$ have the reciprocals of characteristic impedance $c_3$ or, respectively, $vc_3$. Thereby, the aforementioned reciprocals of characteristic impedance are at the same time derived from the characteristic transfer capacitances of the CTD lines.

In FIG. 2, one has proceeded from the fact that a wave passing through the switching circuit 2 experiences the phase rotation $\beta$. In order to have consideration for later realization possibilities, all CTD line sections therefore have a phase constant $\beta$ which is arbitrary per se.

As can be further derived from FIG. 2, each respective line pair is connected via a CTD line which leads from the incoming to the out-going line. In the line pair $p_1$, $q_1$ the reciprocal of characteristic impedance of this connection line is designated with $c_2$; in the line pair $p_2$, $q_2$ the reciprocal of characteristic impedance of the connecting line is designated with $xc_2$ and with $wc_2$ in the line pair $p_3$, $q_3$. It can be further seen that each incoming line is connected with the out-going lines of the other line pairs. These connections consist of at least a section of a CTD line, for example, the section $c_1 + c_1'$ and the section $yc_1'$ or, respectively, $c_1 + c_1'$ and $z \cdot c_1$ and consist further of an amplifier $Q_1$ or, respectively, $Q_1'$ and a galvanic connection $L_1$. The analogous case is true for the connection between the lines $p_3$ and $q_2$ and $p_3$ and $q_1$ as well as between the lines $p_2$ and $q_1$ or, respectively, $p_2$ and $q_3$. For the general case illustrated in FIG. 2, multiplication factors which are referenced with x, y, z, w and z are allocated to the transfer capacitances of the CTD lines. Corresponding amplifiers in the remaining connection lines are referenced with $Q_2$ and $Q_2'$ and with $Q_3$ and $Q_3'$. Appertaining galvanic connection lines are referenced with $L_2$ and $L_3$. As an advantageous embodiment, the amplifiers referenced with the same symbols (e.g. $Q_1$, $Q_1'$) are designed as double amplifiers, thus as amplifiers with only one input and two outputs.

The CTD lines with the transfer capacitances or, respectively, the reciprocals of characteristic impedance $c_1'$, $yc_1'$, $zc_1'$ in FIG. 2 in the interior of the branching may not be connected with one another. This does not represent a realization problem here, because an amplifier output (for example, of $Q_1'$) is connected with a succeeding CTD line (for example, $yc_1'$) by means of a galvanic track (for example, $L_1$) which can be conducted insulated past other tracks) for example, $L_2$, $L_3$).

In the circuit diagram of FIG. 2, moreover, amplifiers can be seen which are designated with the reference numbers $K_4$, $K_4'$, $K_6$ and $K_6'$ and are respectively circuited into the out-or, respectively, in-coming lines gathered together to a line pair. Thereby, the product of the amplification factors should preferably be $K_4 \cdot K_4' = K_6 \cdot K_6' = 1$.

The terms likewise indicated in FIG. 2 state that at those locations to which one or more CTD lines are conducted to a common transfer capacitance, from which locations, again, a plurality of or one CTD line leads away, the sum of the characteristic transfer capacitances of the incoming CTD lines is equal to the sum of the characteristic transfer capacitances of the out-going CTD lines.

In FIG. 3, the scattering matrix of the switching circuit of FIG. 1 is indicated and, in FIG. 4, the scattering matrix for the charge waves $p_1,q_1$, $p_2,q_2,p_3,q_3$ of the switching circuit of FIG. 2. By means of coefficient comparison, the dimensioning specifications in FIG. 5 result as a special case of many possibilities. Deviating from the recommendation for the amplifiers $K_4 \cdot K_4' = 1$, $K_4 \cdot K_4' = -1$ was assumed here. This can be allowed when, in the provided filter, a circuit section is circuited in chain to the switching circuit, with which the product of all amplification factors is equal to 1 within the loop arising by means of the chain circuit.

In another of the possible further dimensionings, the term $K_4 \cdot K_4' = +1$ can also be prescribed in that the operational sign of the elements of the center line or of the center column in the scattering matrix FIG. 3 are oppositely selected. Upon the presupposition $u > v + 1$, it is expedient in a further dimensioning to reverse the operational signs in the third line or column in FIG. 3 in order to fulfill the term $K_6 \cdot K_6' = 1$.

By means of the proposed operational sign interchange, an accordingly realized switching circuit remains suitable for employment in reactance branching circuits, since this only means a phase rotation of 180° in the line concerned.

Let it also be pointed out here that, in the amplifiers designated with K, the gain K is to be understood as voltage amplification factor, whereas it is to be viewed as charge amplification factor in the amplifiers designated with Q.

As can also be seen from FIG. 5, a simplifying notation is produced with the relationship $c_2/c_3 = r$, which is also of significance in the following Figures.

Figure 6:
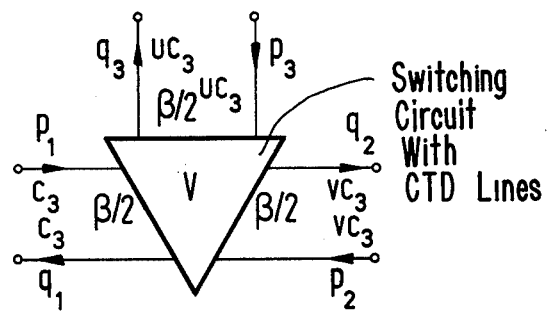
FIG. 6 a graphical symbol according to FIG. 1 or, respectively, FIG. 2 with three line pairs.

FIG. 6 shows a graphical symbol designated with V whose function is carried out in the manner already described in FIG. 2. The incoming and out-going waves, the reciprocals of characteristic impedance and the phase relationships are likewise designated with the same symbols as in FIG. 2.

Figure 7:
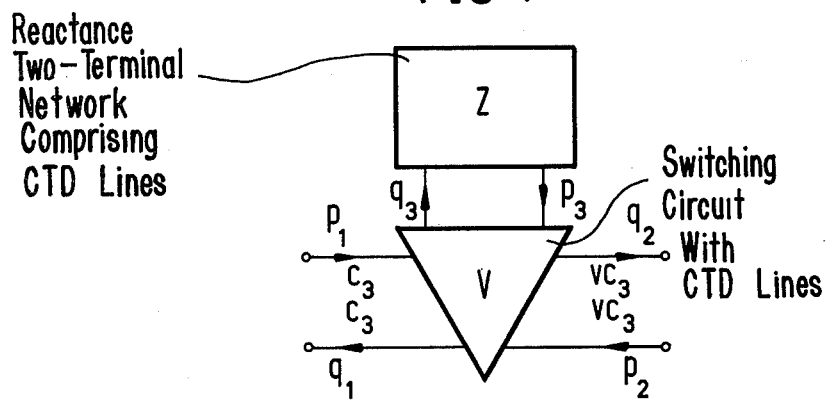
FIG. 7 a switching circuit terminated with a two-terminal network.
Figure 8:
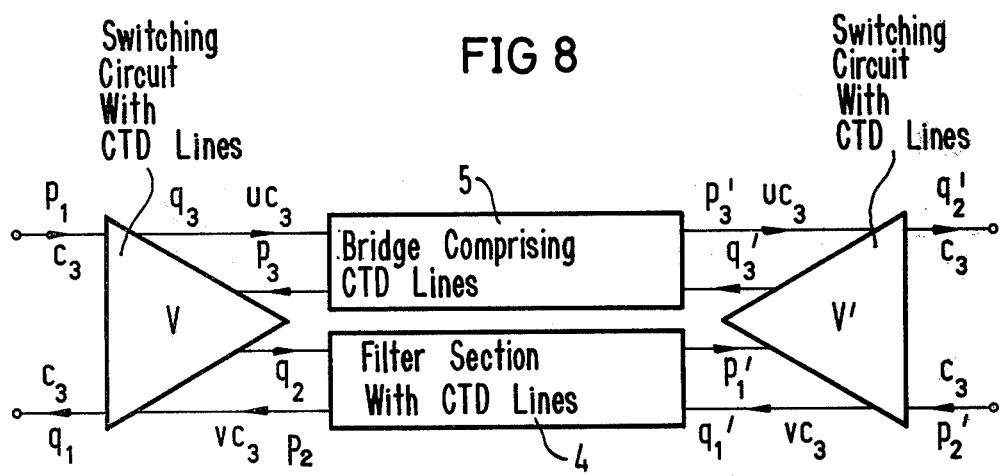
FIG. 8 a further realization alternative for filter circuits with pole locations in the damping function.

FIGS. 7 and 8 show sections of filter circuits in which the graphical symbol V described in FIG. 6 is employed. Circuits of this type are already specified in the earlier application No. P 27 04 318.1. As can be seen from FIG. 7, the switching circuit V is terminated at one side with a two-terminal network Z, and, for example, attenuation peaks can be generated when this two-terminal network Z is designed as a reactance two-terminal network consisting of coupled CTD resonators. Such CTD resonators are likewise already known per se.

FIG. 8 shows the possibility of bridging a filter section, whereby poles of the attenuation function can be generated in physical and complex frequencies. This means that either the attenuation characteristic can be increased in steepness or the transit time behavior in the pass-band can be influenced with such circuits. In FIG. 8, too, the same symbols are inscribed on the incoming and out-going lines as were already explained in conjunction with FIG. 2. As can be further derived from FIG. 8, two switching circuits V and V' are connected with one another there, and, for the purpose of a simple differentiation, the output mangitudes are provided with apostrophes in contrast to the input magnitudes. As can also be seen, a filter section 4 which is realized with CTD lines is connected to the line pair of the first branching V which is designated with $q_2$ and $p_2$. A bridge 5 is connected to the further line pair $p_3$ and $q_3$ of the branching V and it is to be proceeded therefrom that this bridge 5 also consists of CTD lines. The filter circuit 4 and the bridge circuit 5 are reunited on their output side at the second switching circuit V', so that, thus, the line pair $p_1'$ and $q_1'$ of the filter section 4 as well as the line pair $p_3'$ and $q_3'$ of the bridge 5 are united in the switching circuit V'. The output of the switching circuit V' is designated with $q_2'$ and $p_2'$. The factors uv which are likewise respectively inscribed at the line sections have likewise been already explained in conjunction with FIGS. 1 and 2. With regard to the computation, reference can be made here to the known laws of insertion loss theory which, in these filters consisting of CTD lines, too, allow the position of the attenuation peaks and the influencing of the transit time behavior to be selected in a free manner.

If, according to the laws of this theory, real resistances are introduced into the two-terminal network Z according to FIG. 7 or, respectively, into the bridge circuit 5 according to FIG. 8, then corrector circuits for influencing the attenuation process can also be realized with the help of the circuits specified there.

Special cases of a switching circuit are illustrated in FIGS. 9 through 12 in which the dimensioning magnitudes characterizing a line pair have the value zero. In the example of FIG. 9, the line pair $p_3$, $q_3$ is omitted when the terms specified there are fulfilied. Given these terms, the scattering matrix $S'_a$ ensues analogously to FIG. 1 or, respectively, to the relationships specified in FIG. 3. Analogously thereto, FIG. 10 shows the scattering matrix $S'_b$ for circuits according to FIG. 2 with the relationships specified in FIG. 4.

The circuit shown in FIG. 11 is the direct result of the scattering matrix illustrated in FIG. 10. The relationships cited in FIG. 12, which are at the same time the dimensioning specifications for the circuit indicated in FIG. 11, follow from a direct coefficient comparison of the scattering matrices for $S_a'$ and $S_b'$. As already mentioned above, the voltage amplification was designated K and the charge amplification with Q. The relationship between these two magnitudes is additionally indicated in FIG. 11.

FIGS. 13 through 17 show further dimensionings of resonator couplings. In FIG. 13, the scattering matrix of the circuit of FIG. 15 is indicated, in which only amplifiers K are provided which are connected on their input and output side to CTD lines of the same reciprocal of characteristic impedance $c_1$. A coefficient comparison between FIGS. 13 and 14 produces the dimensioning magnitudes of FIG. 15.

In FIGS. 13 and 15, the calculations were not carried out with charge waves p and q but, rather, with voltage waves $u_1,v_1$; $u_2,v_2$ in order to reveal a further variant for the dimensioning of switching circuits with which filter structures with amplifier-free CTD loops can be won.

The circuit of FIG. 15 proceeds from the circuit of FIG. 11 when the dimensioning magnitude $v=1$ is erected there. By so doing, the amplification factors $K_4$ and $K_4'$ also equal 1 and, thus, these amplifiers can be omitted.

FIG. 16 shows an example for the joining of three resonators $R_1, R_2, R_3$, whereby the two amplifiers $K_1'$ and $K_2$ are also respectively combined in a single amplifier $K_1' \cdot K_2$ by means of a simple conversion in the switching elements, so that this single amplifier $K_1' \cdot K_2$ lies only in a single section $c_1$ of this switching circuit which is not at the same time a component part of the resonator $R_1$ or, respectively, $R_2$ or, respectiely, $R_3$.

The circuit in FIG. 17 shows a connection of two resonators $R_1, R_2$ via an additional switching loop 6 with the phase constant $[(\pi/2)-\beta]$, with which the magnitude of the amplification factors $K_1' \cdot K_2$ can be reduced. Physically, this is connected therewith that, upon retention of the band width, the size of the characteristic impedance jumps can be reduced.

Figure 18:
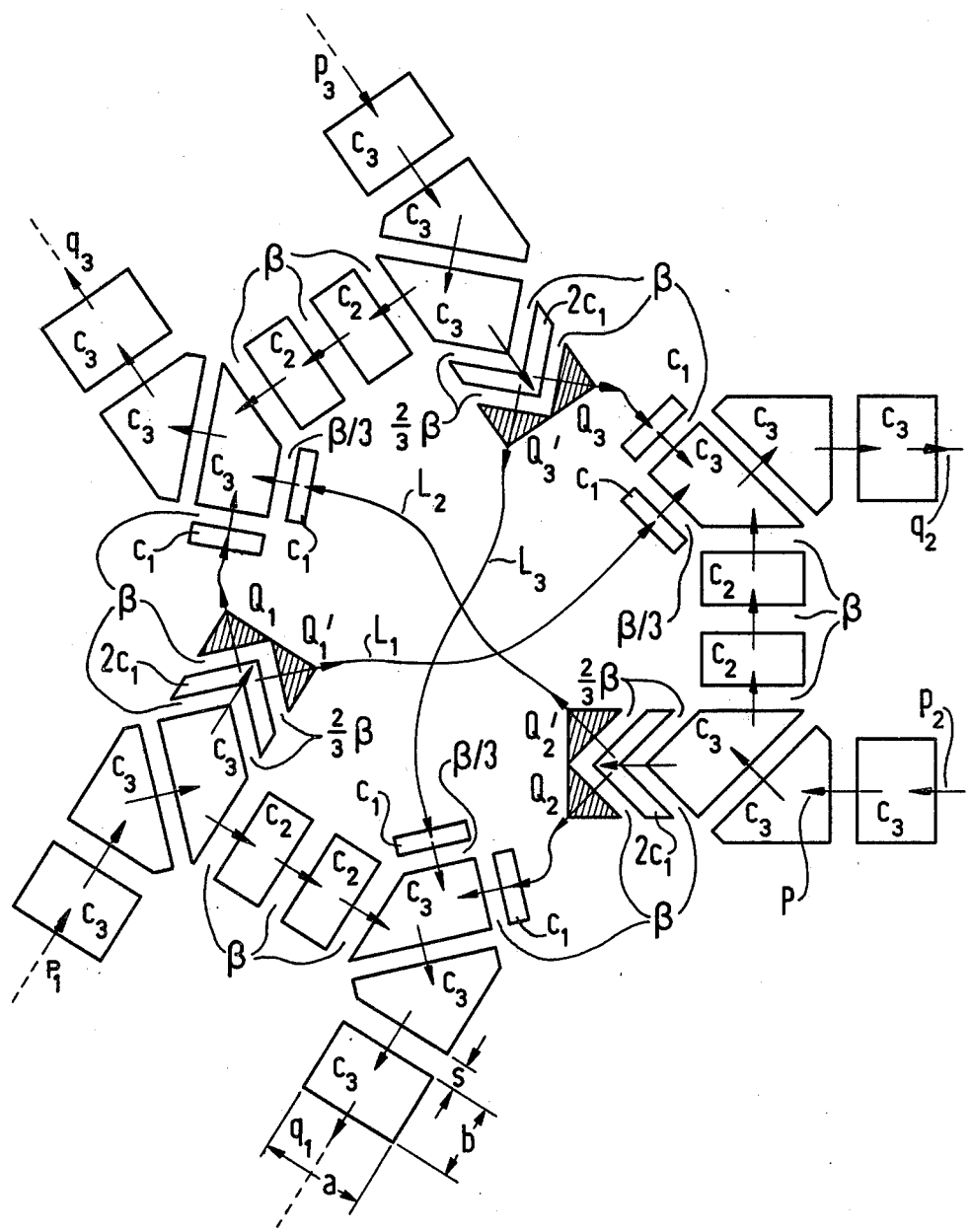
FIG. 18 a realization possibility according to FIG. 2, however, upon employment of the same reciprocals of characteristic impedance for all line pairs.

FIG. 18 schematically shows a CCD switching circuit corresponding to FIG. 2 as a sample embodiment, however, with $u=v=1$ for the sake of simplicity and without the external amplifiers $K_{4,6}, K_{4',6}$. This representation must be designated schematic because, for the sake of a space-saving and clearer presentation, the ratios of the length a to the slit width s as well as of the length a to the width b of the conductive seizure surfaces of the transfer capacitances $c_1, c_2, c_3$ have been selected smaller than in a real realization. Thus, the double amplifiers $Q\mu$, $Q'\mu$ with the common input ($2c_1$) and two outputs ($L\mu, c_1$) are only illustrated as shaded triangles. Thereby, $\mu$ signifies a whole number 1 or, respectively, 2 or, respectively, 3 characterizing the indicia.

Thereby, the galvanic lines $L_1$ through $L_3$ illustrated in FIG. 18 can be produced in the same manner as is usual in the realization of CTD circuits. For example, the lines can be applied onto a substrate in the form of vapor-deposited, conductive coatings, i.e. in the same manner as, for example, the seizures for the transfer capacitances $c_1$ through $c_3$. Silicon conductively doped in the manner of CCD technology can also be employed as the track. As FIG. 2 also reveals, the lines $L_1$ through $L_3$ may not be electrically connected at the cross-over locations. Such tracks which cross one another also do not represent a problem in the technology because it can be seen, too, that a dielectric coating can be introduced between the tracks which cross one another.

Figure 20:
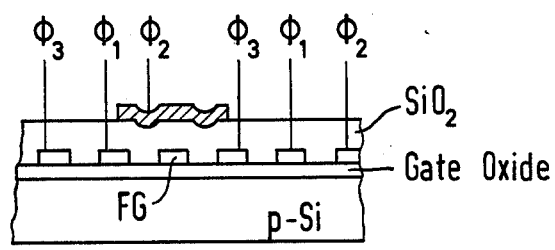
FIG. 20 a cross section through an integrated circuit section according to FIG. 19.
Figure 19:
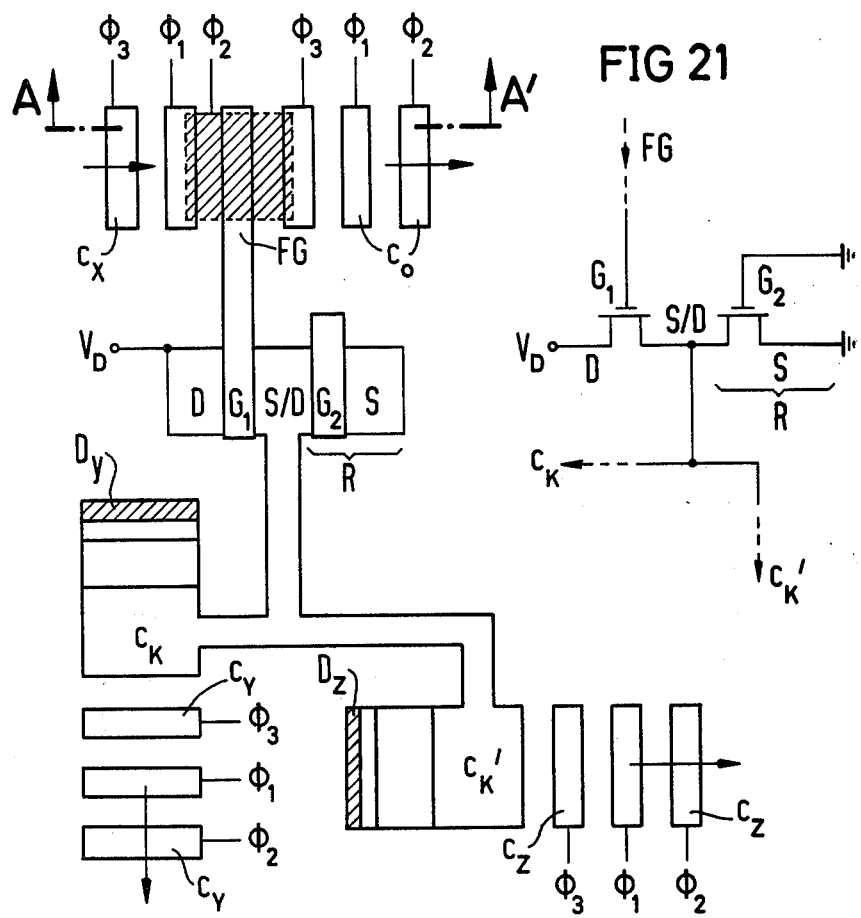
FIG. 19 an example for the realization of amplifiers in CCD technology.
Figure 21:
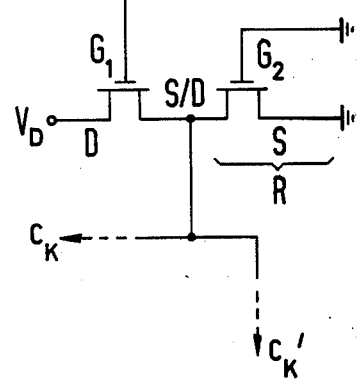
FIG. 21 a section of the substrate top view of FIG. 19, however, with transistor symbols as the electric equivalent circuit diagram.

For the elucidation of the amplifier symbols in FIGS. 2, 11 and 15 through 18, FIG. 19 shows an example for the realization of amplifiers in CCD technology with a so-called "floating gate" coupling-out, as also described, among others, by D. D. Wen under the title "Design and Operating of a Floating Gate Amplifier" in "IEEE Journal of Solid-State Circuits", Vol. SC 9, No. 6, Dec. 1974, Pages 410 through 414. FIG. 20 illustrates the cross section A—A' along the CCD line in FIG. 19 containing a "floating gate" electrode (FG). None of the clock pulse voltages $\phi_1$ through $\phi_3$ is supplied to the FG-electrode; on the contrary, it is connected to the gate $G_1$ of a field effect transistor which works as a source tracker, whereby the source resistor R is realized by means of a further field effect transistor with the gate $G_2$. FIG. 21 shows this section of the substrate top view of FIG. 19 with transistor symbols.

In order not to disturb the charge transport along the CCD line with the transfer capacitances $c_x$ and $c_o$, the CCD electrode for the clock pulse voltage $\phi_2$ is arranged above the FG-electrode. The voltage appearing at the FG-electrode controls the current flow through both field effect transistors and, thus, the voltage at the source/drain (S/D) electrode with which the transfer capacitances $c_K$ and $c_K'$ are charged. A charge amplification is given with $c_K$ or, respectively, $c_K' > c_x$; with $c_K > c_y$ and $c_K' > c_z$, the charge amplification is converted into a voltage amplification. Thereby, $c_y$ and $c_z$ are the transfer capacitances of two further CCD lines. The charging of the capacitances $c_K$ or, respectively, $c_K'$ with the help of diodes $D_y$ or, respectively, $D_z$ and, thus, the feeding-in of a signal into a CCD line is described by C. M. Sequin and A. M. Mohsen under the title "Linearity of Electrical Charge Injection into Charge-Coupled Devices" in "IEEE Journal of Solid-State Circuits", Vol. SC-10, No. 2, April 1975, Pages 81 through 92.

A double amplifier, for example, $Q_1,Q_1'$ in FIG. 2 or, respectively, FIG. 18, is produced with $c_x=c_1+c_1'$ or, respectively, $2c_1; c_y=zc_1$ or, respectively, $c_1$ and $c_z=yc_1'$ or, respectively, $c_1$. Moreover, the charge arriving at the transfer capacitance $c_o$ must be eliminated (destroyed) after each transfer process in order to be ready to receive the next succeeding charge parcel. This also applies for the realization, for example, of the amplifier $K_4$ in FIG. 2, for which $c_x=c_y=vc_3$ and $c_z=c_K'=0$ are to be erected.

We claim:

1. A switching circuit including CTD lines each of which can transfer charge unidirectionally and each of which has a characteristic transfer capacitance which determines the reciprocal of the characteristic impedance of the line comprising:
   a first and a second semiconductor means for unidirectional transfer of charge, each including a CTD line;
   a third and a fourth semiconductor means for unidirectional transfer of charge, each including a CTD line;
   a fifth and a sixth semiconductor means for unidirectional transfer of charge, each including a CTD line;
   said CTD lines in said first and second semiconductor means being interconnected at a first end by a first, cross-connected CTD line to form a first line-pair capable of conducting selected quantities of charge inwardly through said CTD line of said first semiconductor means, across said first, cross-connected CTD line and outwardly through said CTD line of said second semiconductor means;
   said CTD lines in said third and fourth semiconductor means being interconnected at a first end by a second cross-connected CTD line to form a second line-pair capable of conducting selected quantities of charge inwardly through said CTD line of said third semiconductor means, across said second cross-connected CTD line and outwardly through said CTD line of said fourth semiconductor means;
   said CTD lines in said fifth and sixth semiconductor means being interconnected at a first end by a third, cross-connected CTD line to form a third line-pair capable of conducting selected quantities of charge inwardly through said CTD line of said fifth semiconductor means across said third, cross-connected, CTD line and outwardly through said CTD line of said sixth semiconductor means;
   said first end of said CTD line of said first semiconductor means being connected to said first end of said CTD line of said fourth semiconductor means and to said first end of said CTD line of said sixth semiconductor means through a first means for conduction;
   said first end of said CTD line of said third semiconductor means being connected to said first end of said CTD line of said second semiconductor means and to said first and of said CTD line of said sixth semiconductor means through a second means for conduction;
   said first end of said CTD line of said fifth semiconductor means being connected to said first end of said CTD line of said second semiconductor means and said first end of said CTD line of said fourth semiconductor means by a third means for conduction;
   said line-pairs and said means for conduction forming a three terminal-pair network.

2. The switching circuit according to claim 1 wherein said means for conduction each comprise:
   a selected CTD line connected to a means for amplification.

3. The switching circuit according to claim 2 wherein:
   said means for amplification includes a first and a second output port with said first output port being connected through a selected CTD line to a said first end of a respective outwardly charge carrying CTD line of a respective selected semiconductor means; and
   said second output port being connected through a galvanic connection to a said first end of a respective output charge carrying CTD line of a different respective selected semiconductor means.

4. The switching circuit according to claim 1 wherein:
   the characteristic transfer capacitance of each said inwardly charge carrying CTD line is substantially equal to the sum of the total characteristic transfer capacitance of each said respective cross-connected CTD line and each said respective means for conduction connected to said inwardly charge carrying CTD line; and
   the characteristic transfer capacitance of each said outwardly charge carrying CTD line is substantially equal to the sum of the characteristic transfer capacitance of each said respective cross-connected CTD line and each said respective means for conduction connected to said outwardly charge carrying CTD line.

5. The switching circuit according to claim 1 wherein:
   a selected one of said semiconductor means for unidirectional transfer of charge includes at least one means for amplification.

6. The switching circuit according to claim 1 including further:
a two terminal reactance network connected between a second end of each of said semiconductor means for unidirectional transfer of charge of said third line-pair;
said two terminal reactance network corporating with said three line-pairs and said means for conduction to form an electronic filter.

7. The switching circuit according to claim 1 with:
a first amplifier located in a selected one of said two semiconductor means for unidirectional transfer of charge of a selected line-pair and a second amplifier located in a second of said two semiconductor means for unidirectional transfer of charge of said selected line-pair;
said first amplifier having an amplification factor corresponding to the reciprocal of an amplification factor of said second amplifier.

8. The switching circuit according to claim 1 wherein:
each said means for conduction includes a selected CTD line and an amplifier.

9. A switching circuit comprising:
a first and a second three terminal-pair network;
means for filtering connected between a first terminal-pair of each of said first and second three terminal-pair networks;
each said three terminal-pair network including CTD lines each of which can transfer charge unidirectionally and each of which has a characteristic transfer capacitance which determines the reciprocal of the characteristic impedance of the line, each said three terminal-pair network comprising:
a first and a second semiconductor means for unidirectional transfer of charge, each including a CTD line;
a third and a fourth semiconductor means for unidirectional transfer of charge, each including a CTD line;
a fifth and a sixth semiconductor means for unidirectional transfer of charge, each including a CTD line;
said CTD lines in said first and second semiconductor means being interconnected at a first end by a first, cross-connected CTD line to form a first line-pair capable of conducting selected quantities of charge inwardly through said CTD line of said first semiconductor means, across said first, cross-connected CTD line and outwardly through said CTD line of said second semiconductor means;
said CTD lines in said third and fourth semiconductor means being interconnected at a first end by a second cross-connected CTD line to form a second line-pair capable of conducting selected quantities of charge inwardly through said CTD line of said third semiconductor means, across said second cross-connected CTD line and outwardly through said CTD line of said fourth semiconductor means;
said CTD lines in said fifth and sixth semiconductor means being interconnected at a first end by a third, cross-connected CTD line to form a third line-pair capable of conducting selected quantities of charge inwardly through said CTD line of said fifth semiconductor means across said third, cross-connected, CTD line and outwardly through said CTD line of said sixth semiconductor means
said first end of said CTD line of said first semiconductor means being connected to said first end of said CTD line of said fourth semiconductor means and to said first end of said CTD line of said sixth semiconductor means through a first means for conduction;
said first end of said CTD line of said third semiconductor means being connected to said first end of said CTD line of said second semiconductor means and to said first end of said CTD line of said sixth semiconductor means through a second means for conduction;
said first end of said CTD line of said fifth semiconductor means being connected to said first end of said CTD line of said second semiconductor means and said first end of said CTD line of said fourth semiconductor means by a third means of conduction;
said line-pairs and said means for conduction forming a three terminal-pair network.

10. The switching circuit according to claim 9 including further:
a plurality of selectively connected CTD lines connected between a second terminal-pair of each of said first and second three terminal-pair networks.

11. The switching circuit according to claim 9 including further:
a bridge circuit connected between a second terminal-pair of each of said first and second three terminal-pair networks.

12. The switching circuit according to claim 9 including further:
an impedance quadripole formed of selectively connected CTD lines connected between a second terminal-pair of each of said first and second three terminal-pair networks.

13. An electrical circuit forming a bidirectional branch point comprising:
a first and a second semiconductor means for unidirectional transmission of selected quantities of charge;
a third and a fourth semiconductor means for unidirectional transmission of selected quantities of charge;
a fifth and a sixth means for unidirectional transmission of selected quantities of charge;
said first and said second means for unidirectional transmission each being interconnected at a first end to a means for connection to form a first line-pair; said first means for unidirectional transmission conducting said selected quantities of charge toward said means for connection and
said second means for unidirectional transmission conducting said selected quantities of charge away from said means for connection;
said third and fourth means for unidirectional transmission each being interconnected at a first end to said means for connection to form a second line-pair;
said third means for unidirectional transmission conducting said selected quantities of charge toward said means for connection and said fourth means for unidirectional transmission conducting said selected quantities of charge away from said means for conduction;

said fifth and said sixth means for transmission each being interconnected at a first end to said means for connection to form a third line-pair;

said fifth means for transmission conducting said selected quantities of charge toward said means for connection and said sixth means for unidirectional transmission conducting said selected quantities of charge away from said means for connection;

said semiconductor means for unidirectional transmission and said means for connection thereby forming a three terminal-pair bidirectional branch point circuit.

14. The electric circuit according to claim 13 wherein said means for connection includes:
   a seventh semiconductor means for unidirectional transmission of selected quantities of charge cross-connected between said first ends of said first and second semiconductor means for unidirectional transmission of charge to conduct selected quantities of charge between said first and said second means; and
   an eighth semiconductor means for unidirectional transmission of selected quantities of charge cross-connected between said first ends of said third and fourth semiconductor means for unidirectional transmission of charge to conduct selected quantities of charge between said third and fourth means;
   a ninth semiconductor means for unidirectional transmission of selected quantities of charge cross-connected between said first ends of said fifth and sixth semiconductor means for unidirectional transmission of charge to conduct selected quantities of charge between said fifth and said sixth means.

15. An electrical circuit according to claim 13 wherein each said semiconductor means for unidirectional transmission comprises:
   a selected CTD line with a selected transfer capacitance and wherein the characteristic transfer capacitance of each said inwardly charge carrying CTD line is substantially equal to the sum of the total characteristic transfer capacitance of each said respective cross-connected semiconductor means for unidirectional transmission and said respective means for connection connected to said inwardly charge carrying CTD line; and
   the characteristic transfer capacitance of each said outwardly charge carrying CTD line is substantially equal to the sum of the characteristic transfer capacitance of each said respective cross-connected semiconductor means for unidirectional transmission and each said respective means for connection connected to said outwardly charge carrying CTD line.

16. The electrical circuit according to claim 13 wherein:
   a second end of each of said fifth and sixth semiconductor means for unidirectional transmission is connected to a first and a second terminal of a two terminal means for resonating operative to display a selected reactive impedance between said two terminals.

17. The electrical circuit according to claim 16 wherein said means for resonating comprises selected, interconnected charge transfer devices.

18. A filter formed from a switching circuit including CTD lines each of which can transfer charge unidirectionally and each of which has a characteristic transfer capacitance which determines the reciprocal of the characteristic impedance of the line, the filter comprising:
   a first and a second semiconductor means for unidirectional transfer of charge, each including a CTD line with a first characteristic transfer capacitance;
   a third and a fourth semiconductor means for unidirectional transfer of charge, each including a CTD line;
   a first cross-connected CTD line with a second characteristic transfer capacitance connected between a first end of each said CTD line in said first and second semiconductor means to form a first line-pair capable of conducting selected quantities of charge inwardly through said CTD line of said first semiconductor means, across said first, cross-connected CTD line and outwardly through said CTD line of said second semiconductor means;
   said CTD lines in said third and fourth semiconductor means being interconnected at a first end by a second cross-connected CTD line to form a second line-pair capable of conducting selected quantities of charge inwardly through said CTD line of said third semiconductor means, across said second cross-connected CTD line and outwardly through said CTD line of said fourth semiconductor means;
   said first end of said CTD line of said first semiconductor means being connected to said first end of said CTD line of said fourth semiconductor means through a first means for conduction including an amplifier and a selected CTD line, said selected CTD line having a third characteristic transfer capacitance where connected to said first end of said CTD line of said first semiconductor means;
   said first end of said CTD line of said third semiconductor means being connected to said first end of said CTD line of said second semiconductor means through a second means for conduction including an amplifier and a selected CTD line.

19. The switching circuit according to claim 18 wherein said third and said fourth semiconductor means for unidirectional transfer of charge each includes an amplifier with a selected gain.

20. The switching circuit according to claim 18 wherein said first, cross-connected CTD line and said second cross-connected CTD line each have the same, selected phase constant.

* * * * *